United States Patent
Charath et al.

(10) Patent No.: US 7,549,074 B2
(45) Date of Patent: Jun. 16, 2009

(54) CONTENT DESKEWING FOR MULTICHANNEL SYNCHRONIZATION

(75) Inventors: Ravikumar K. Charath, Bangalor (IN); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 635 days.

(21) Appl. No.: 11/143,370

(22) Filed: Jun. 2, 2005

(65) Prior Publication Data

US 2006/0273941 A1    Dec. 7, 2006

(51) Int. Cl.
*G06F 1/12* (2006.01)
(52) U.S. Cl. .................... 713/503; 713/400; 713/401
(58) Field of Classification Search ............ 713/400, 713/401, 503
See application file for complete search history.

(56) References Cited

U.S. PATENT DOCUMENTS

| | | | | |
|---|---|---|---|---|
| 6,917,366 B1 * | 7/2005 | West et al. | ............... | 345/558 |
| 2002/0018444 A1 * | 2/2002 | Cremin et al. | ............... | 370/235 |
| 2006/0092969 A1 * | 5/2006 | Susnow et al. | ............... | 370/465 |
| 2006/0161702 A1 * | 7/2006 | Bowlby et al. | ............... | 710/71 |

* cited by examiner

*Primary Examiner*—Thomas Lee
*Assistant Examiner*—Paul B Yanchus, III

(57) ABSTRACT

The various embodiments of the invention provide an apparatus, system and method for data content deskewing among a plurality of data channels for data synchronization. The various embodiments determine whether a data alignment signal has been written, for each data channel of the plurality of data channels, such as a comma character. When a data alignment signal has been written in a data channel of the plurality of data channels, the embodiments determine a corresponding channel location of the data alignment signal for each data channel having the data alignment signal. When each data channel of the plurality of data channels has the data alignment signal, and when the data alignment signal is to be read on a next read cycle in at least one data channel, the various embodiments move a corresponding read pointer for each data channel of the plurality of data channels to the corresponding channel location of the data alignment signal. The data alignment signal is then read in all channels during the next read cycle, followed by subsequent reading of deskewed or otherwise synchronized data, such as for conversion of parallel data into serial data for subsequent data transmission.

21 Claims, 6 Drawing Sheets

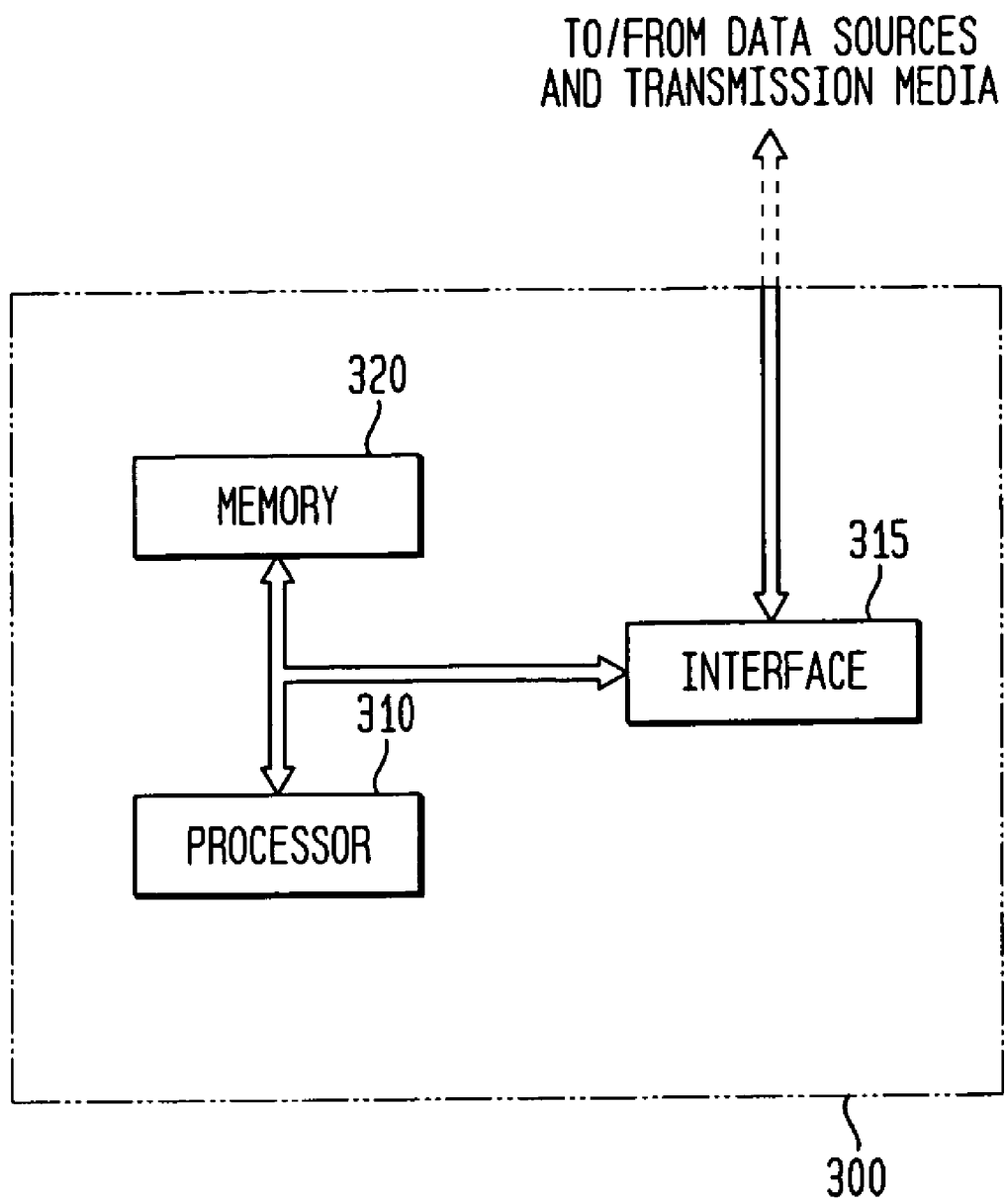

ns networks, and may also include related digital and analog electronics. In an exemplary embodiment, the processor is adapted to determine whether a data alignment signal has been written, for each data channel of the plurality of data channels; to determine a corresponding channel location of the data alignment signal for each data channel having the data alignment signal, when a data alignment signal has been written in a data channel of the plurality of data channels; and to move a corresponding read pointer for each data channel of the plurality of data channels to the corresponding channel location of the data alignment signal, when each data channel of the plurality of data channels has the data alignment signal and when the data alignment signal is to be read on a next read cycle in at least one data channel.

CONTENT DESKEWING FOR MULTICHANNEL SYNCHRONIZATION

FIELD OF THE INVENTION

The present invention relates in general to data alignment for synchronization among multiple data communication channels and, more particularly, to content deskewing First-In First-Out memories for data synchronization among multiple data communication channels such as multiple channel Serializer/Deserializer communication devices.

BACKGROUND OF THE INVENTION

Serializer/deserializer ("SERDES") devices are frequently used in high-speed communication networks in which an interface must be provided between parallel bus-connected devices and high-speed serial communication networks, such as those implemented through optical fiber interconnections. For these applications, a system (such as a computer processor and related devices) writes in parallel to a plurality of First-In First-Out memories or registers ("FIFOs"), with each write cycle based on a system clock, and with each FIFO corresponding to one of the parallel data channels or data paths. In turn, a SERDES device will read from each such parallel FIFO, with each read cycle based on a SERDES clock, and convert the parallel data into serial data, such as for serial data transmission.

Because such write and read operations are based on different clocks which are not synphase with each other, data alignment issues arise, in which data content of a selected channel may be misaligned or skewed with respect to data content of another selected channel. As a consequence, a data alignment or data synchronization signal, such as a "comma" signal in various data transmission and data bus standards, is utilized to provide alignment among the various data channels.

In current systems, upon the occurrence of such a comma, write pointers are advanced to the first comma location of one of the channels, so that all FIFOs or channels are then written to simultaneously in the next write cycle. Such current alignment systems, however, provide for potentially overwriting data and the transmission of potentially corrupted data.

As a consequence, a need remains for a multichannel data alignment or data synchronization apparatus, system and method which provides for accurate data alignment, while minimizing the potential for data overwriting and transmission of corrupted data.

SUMMARY OF THE INVENTION

The various method, system and apparatus embodiments of the present invention provides for data alignment and synchronization, without allowing data to be corrupted or overwritten, by alignment and synchronization of each read pointer for each data channel of a multichannel system. When all channels which are to be synchronized have received a data alignment or synchronization signal (such as a comma character used in fiber optic communication), and when the next FIFO block to be read in one of the channels is such a data alignment or synchronization signal (comma), then all read pointers are advanced or moved to their corresponding comma locations for reading from the corresponding FIFO. When either or both of these conditions is or are not met, the read pointers are not altered, with data conversion or transmission continuing without interruption or change.

The invention may be embodied, for example, in a SERDES device, providing synchronization among the plurality of parallel data channels which will be converted to a serial bit stream.

In a first aspect of the invention, a method for data content deskewing among a plurality of data channels for data synchronization is provided. The method includes determining whether a data alignment signal has been written, for each data channel of the plurality of data channels; when a data alignment signal has been written in a data channel of the plurality of data channels, determining a corresponding channel location of the data alignment signal for each data channel having the data alignment signal; and when each data channel of the plurality of data channels has the data alignment signal, and when the data alignment signal is to be read on a next read cycle in at least one data channel, moving a corresponding read pointer for each data channel of the plurality of data channels to the corresponding channel location of the data alignment signal.

Depending upon the selected embodiment, the data alignment signal may be a comma character. Depending upon the location of the data alignment signal, the read pointer may be advanced to a data location for data which has not been read previously, or may be moved to a data location for data which has been read previously.

Following the movement of the read pointers, the method includes synchronously reading the data alignment signal from each data channel of the plurality of data channels during the next read cycle. This is followed by synchronously reading data in parallel from each data channel of the plurality of data channels during a subsequent read cycle. When included in a SERDES device, the method further synchronously reads the data in parallel from each data channel of the plurality of data channels for serial data transmission.

The various embodiments further determine the corresponding channel location of the data alignment signal for each data channel having the data alignment signal by decoding the data alignment signal and storing a data alignment bit in a data alignment signal register. Subsequently, the movement of the corresponding read pointer for each data channel of the plurality of data channels to the corresponding channel location of the data alignment signal is facilitated by copying the data alignment signal register to a read pointer register.

In another aspect of the invention, an apparatus for data content deskewing among a plurality of data channels for data synchronization is provided. The apparatus includes a data memory; a read pointer register coupled to the data memory, the read pointer register adapted to store a read pointer address; a write pointer register coupled to the data memory, the write pointer register adapted to store a write pointer address; a data alignment signal decoder adapted to determine a presence of a data alignment signal in data written to the data memory; a data alignment signal register adapted to store a data memory location when the data alignment signal has been written to the data memory; and a state machine coupled to the data memory, the state machine adapted to determine whether the data alignment signal has been written to the data memory; and to move the read pointer to data memory location of the data alignment signal when each data channel of the plurality of data channels has the data alignment signal and when the data alignment signal is to be read on a next read cycle in at least one data channel.

In another aspect of the invention, a system for data content deskewing among a plurality of data channels for data synchronization is provided. The system includes a memory and a processor, and may further include an interface for coupling to the various data sources and communication or transmission media, such as parallel busses or serial transmission lines. The memory is adapted to store data for each data channel of the plurality of data channels and, for each data channel, further adapted to store a read pointer, a write pointer, and a data alignment signal bit. The processor is adapted to determine whether a data alignment signal has been written, for each data channel of the plurality of data channels; to determine a corresponding channel location of the data alignment signal for each data channel having the data alignment signal; and to move a corresponding read pointer for each data channel of the plurality of data channels to the corresponding channel location of the data alignment signal when each data channel of the plurality of data channels has the data alignment signal, and when the data alignment signal is to be read on a next read cycle in at least one data channel. Such a system, for example, may be included or embodied in a serializer/deserializer.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, in which:

FIG. 6 is a block diagram illustrating a system embodiment in accordance with the present invention.

DETAILED DESCRIPTION OF THE EXEMPLARY EMBODIMENTS

Figure 1:
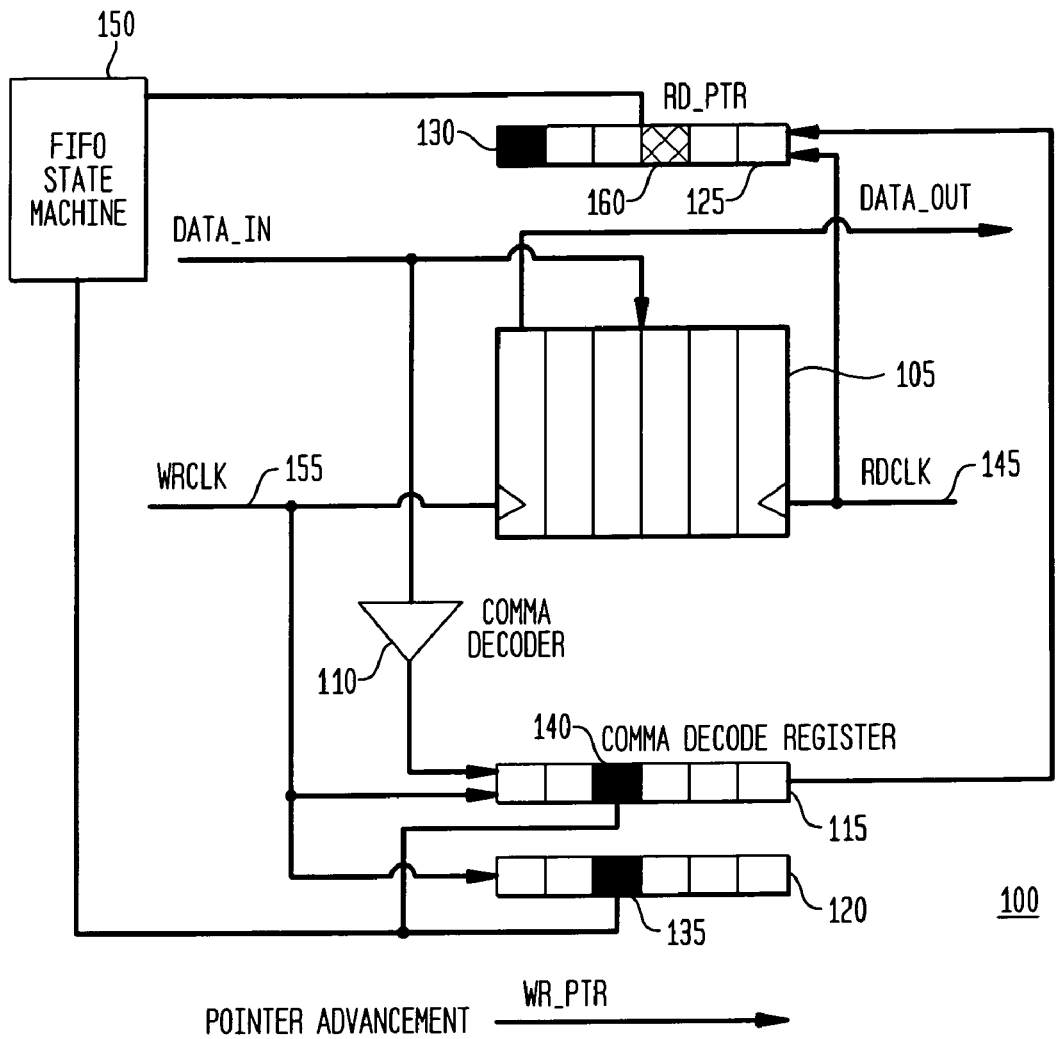
FIG. 1 is a block diagram illustrating a first exemplary apparatus embodiment in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As indicated above, the present invention provides for data alignment and synchronization, with minimizing the probability of data becoming corrupted or overwritten, by alignment and synchronization of each read pointer for each data channel of a multichannel system. The invention is particularly useful for data deskewing when data is transmitted over several serial links, such as 10 Gigabit per second (bps) Ethernet data transmitted over four 2.5 G bps fiber channels. Synchronzing the data transmitted through these serial links provides for easier reassembly of parallel data at the receiving end.

In accordance with the exemplary embodiments, when all channels which are to be synchronized have received a data alignment or synchronization signal (such as a comma character), and when the next FIFO block to be read in one of the channels is such a data alignment or synchronization signal (comma), then all read pointers are advanced or moved to their corresponding comma locations for reading from the corresponding FIFO. When either or both of these conditions is or are not met, the read pointers are not altered, with data conversion or transmission continuing without interruption or change.

More particularly, the content deskewing of the present invention, such as embodied as a content deskewing FIFO illustrated in FIG. 1, allows for deskewing (re-aligning or synchronizing) incoming data in multiple, parallel lanes. FIG. 1 is a block diagram illustrating a first exemplary apparatus 100 embodiment in accordance with the present invention. The deskewing is performed on the read side of the a FIFO 105 (or other register or memory), when commas or other synchronization signals have arrived for all of the relevant or selected channels (i.e., for those channels to be synchronized to, for example, generate a corresponding serial data stream). The deskewing is performed by dropping extra bytes or repeating bytes beginning from the comma in the channel, by manipulating the read pointer (RD_PTR) advancement. Once all such read pointers have been so advanced or moved, the comma and subsequent bytes are read synchronously.

Every time deskewing is enabled, a FIFO state machine 150 (or other processor) waits until comma characters are in all of the enabled channels. When one or more channels are about to read a comma character, the read pointers in all channels are adjusted in a way that every channel reads a comma character next. The deskewing is performed once after deskewing is enabled. If comma characters are not present in all of the enabled channels, read pointer adjustment does not occur, and the FIFO 105 functions as a transparent data buffer.

Referring to FIG. 1, the FIFO 105 is illustrated, as an example, with six memory locations. Input parallel data (DATA_IN) is written to the write pointer (WR_PTR) location 135 on the write clock (WRCLK) 155 cycle (generally the rising edge), and parallel output data (DATA_OUT) is read from the read pointer location 130 on the read clock (RDCLK) 145 cycle (also generally the rising edge). As indicated, the addresses for write and read operations are determined by the write and read pointers WR_PTR and RD_PTR, respectively, which are usually implemented as shift registers (120 and 125, respectively). Every time a comma character is written into the FIFO 105, it is concomitantly decoded (comma decoder 110), and a comma bit is written into comma decode register 115 (with a comma illustrated in location 140 of comma decode register 115). When read pointer advancement or other manipulation is to occur, the comma location is copied into the read pointer register 125, illustrated as read pointer location 160.

Figure 2:
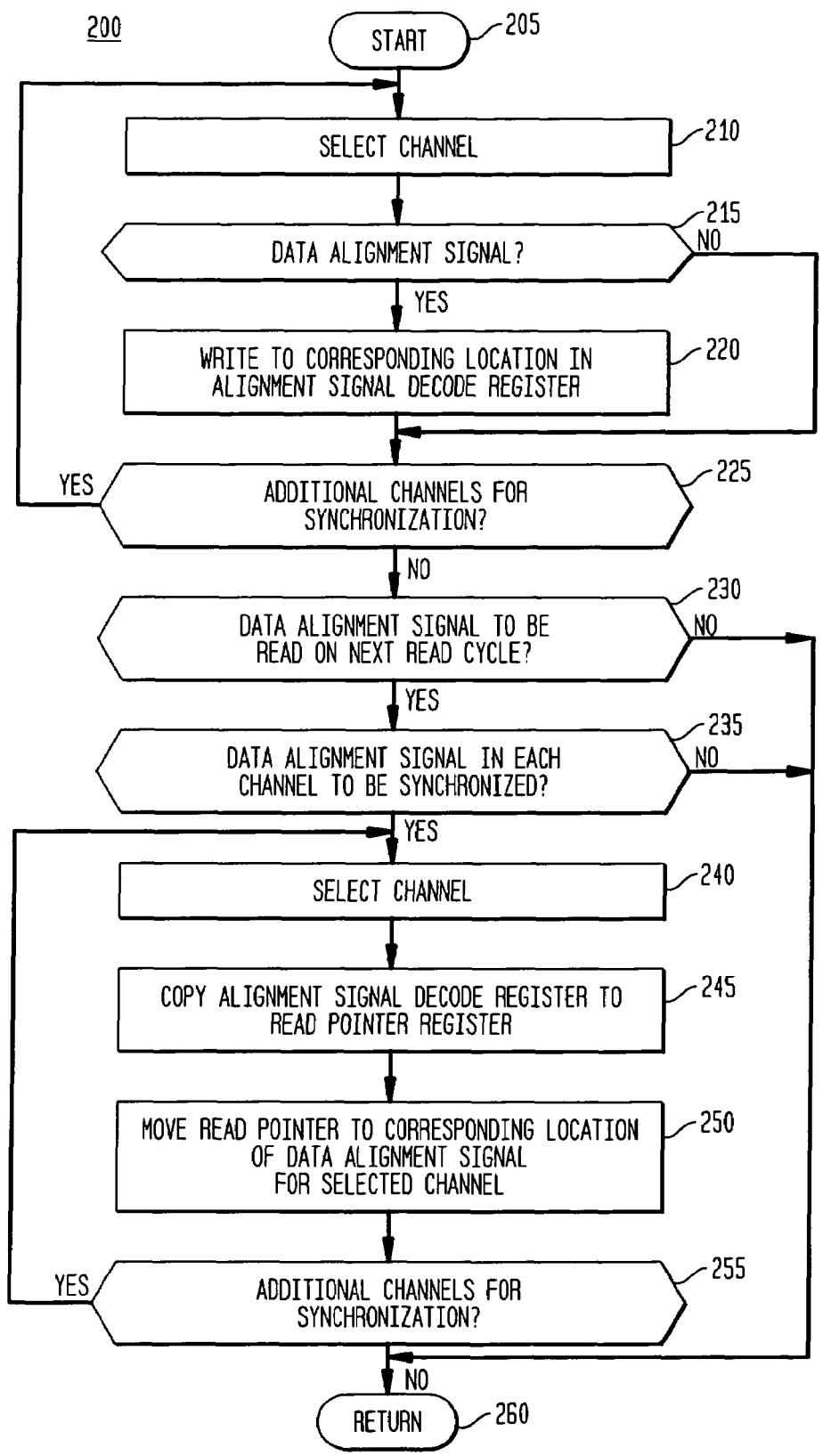
FIG. 2 is a flow diagram illustrating an exemplary method embodiment in accordance with the present invention.

FIG. 2 is a flow diagram illustrating an exemplary method 200 embodiment in accordance with the present invention. The deskewing method begins, start step 205, with selection of a channel, such as a FIFO 105. The method determines whether a data alignment signal such as a comma has been received, step 215. If no such data alignment or synchronization signal has been received, the method proceeds to step 225, to check other channels. When a data alignment signal has been received in step 215, the method writes a comma decode register bit (1) to a corresponding location in the data alignment signal decode register, such as to location 140 in comma decode register 115. The method determines whether there are additional channels for synchronization, step 225, and if so, returns to step 210 to select another channel.

It should be noted that for explanatory purposes, steps 210-225 and steps 230-255 are illustrated sequentially in FIG. 2. In exemplary embodiments, however, these two sets of steps are generally independent and run in parallel. In steps 210-225, as the first part of a state machine 150, the state machine starts on the rising edge of WRCLK and takes care of writing data in the proper FIFO location, detecting the alignment character, writing it into a proper location of the decode register, and finally advancing WR_PTR to prepare for the next write. The second part of the state machine, described below with respect to steps 230-255, is triggered on the rising edge of RDCLK. It either advances RD_PTR, or copies it from the decode register, if conditions for alignment hold.

When all channels have been checked for data alignment signals (commas), the method determines whether a data alignment signal is to be read on the next read cycle, step 230. If so, the method determines whether there is a data alignment signal in each channel to be synchronized, step 235. If either or both of these conditions of steps 230 and 235 have not been met, the method may end, return step 260. When a data alignment signal is to be read on the next read cycle and when there is a data alignment signal in each channel to be synchronized, the method proceeds to step 240, and selects one of the channels to by synchronized.

For the selected channel, the method copies the alignment register (e.g., comma decode register 115) location contents to the read pointer register 125, step 245, and moves the read pointer of the selected channel to the corresponding location of the data alignment signal, step 250. When there are additional channels to be synchronized in step 255, the method returns to step 240, and repeats steps 245 and 250 for each such channel. When there are no additional channels, the method may end, return step 260. As the read pointers now have been advanced or moved for each channel to be synchronized, on the next read cycle, each such channel will read a data alignment signal such as a comma, followed by reading content synchronously. Examples of this process for four channels are illustrated and discussed below with respect to FIGS. 3-5.

Figure 3:
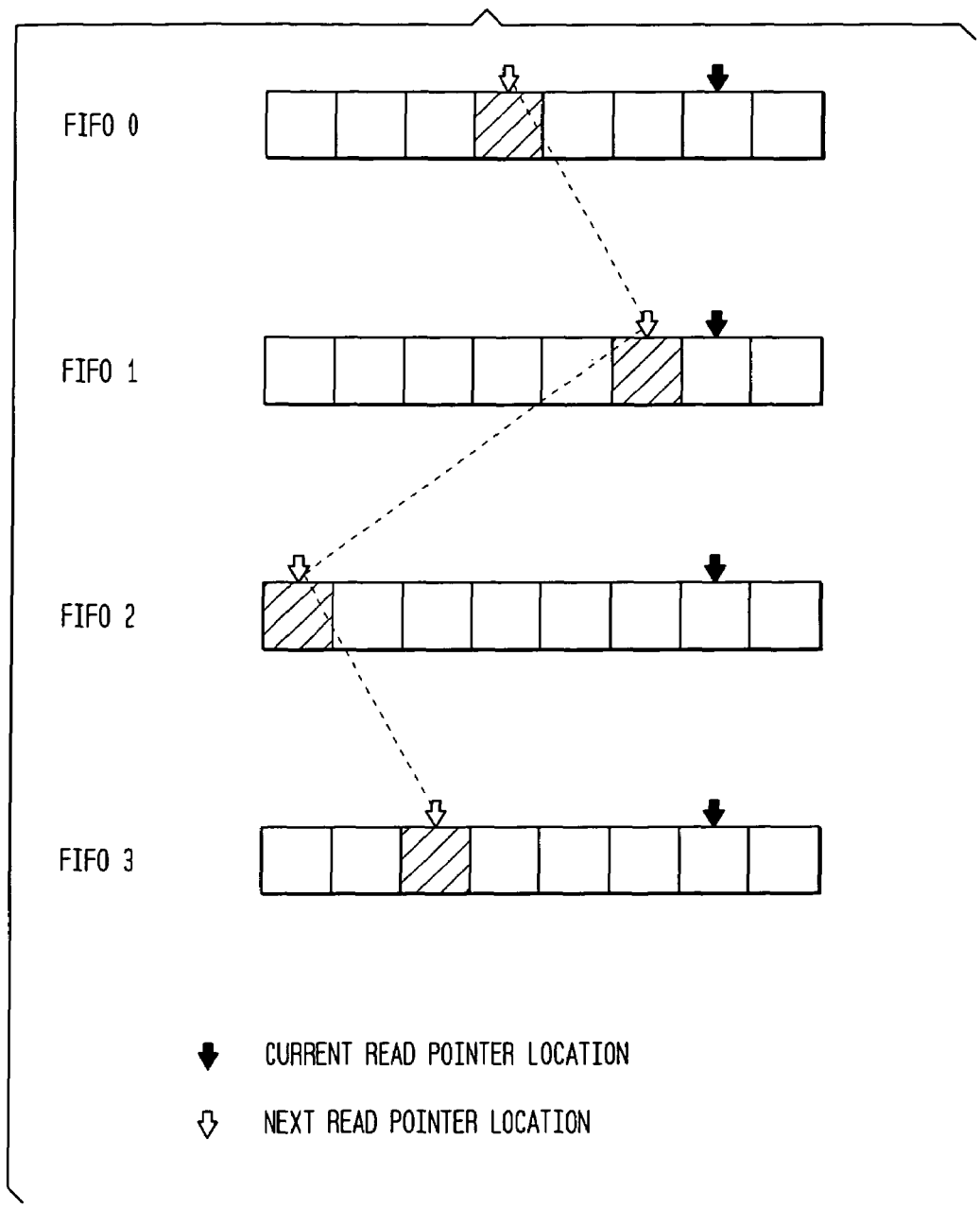
FIG. 3 is a block diagram illustrating a first exemplary read pointer alignment among multiple FIFOs in accordance with the present invention.
Figure 4:
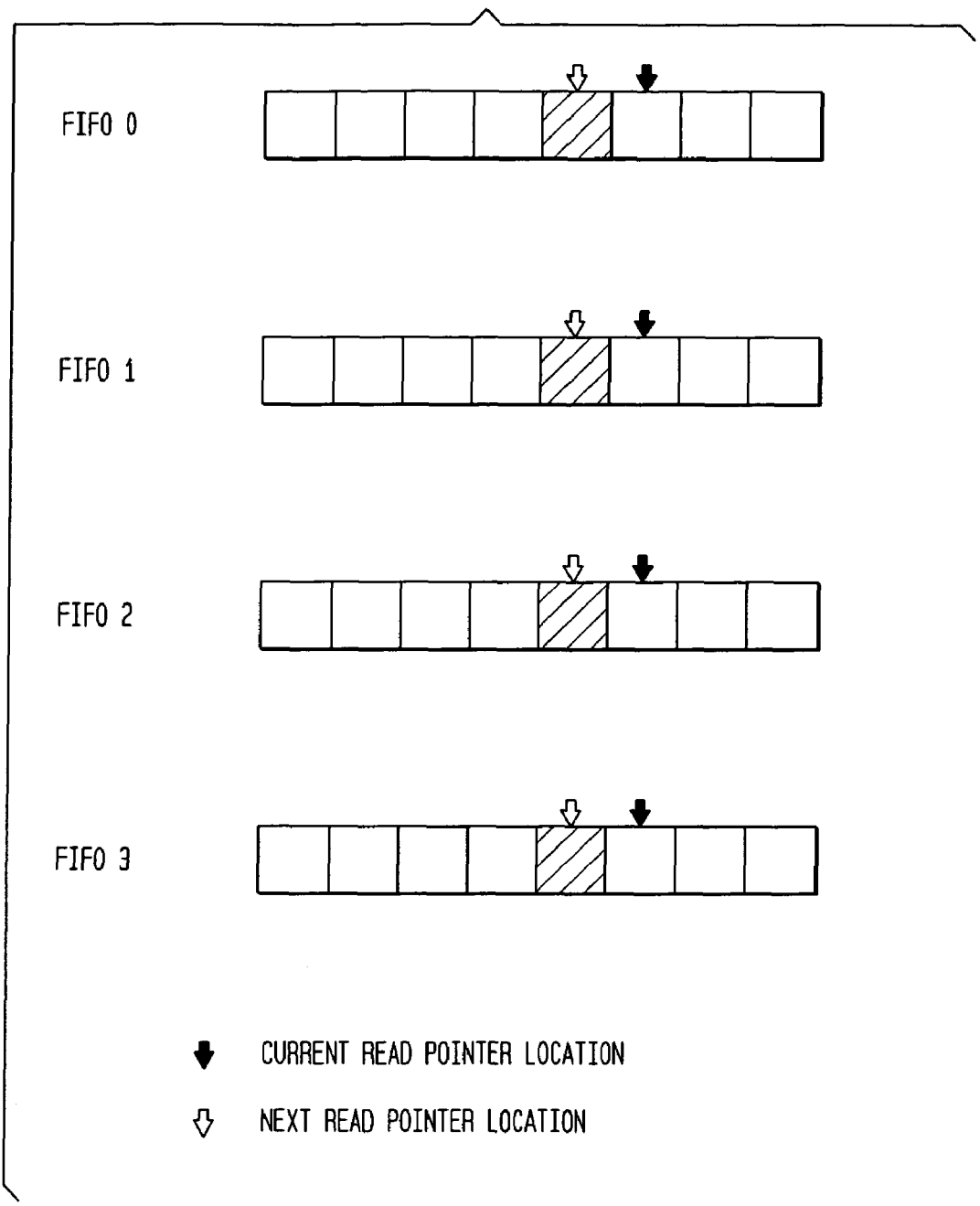
FIG. 4 is a block diagram illustrating a second exemplary read pointer alignment among multiple FIFOs in accordance with the present invention.
Figure 5:
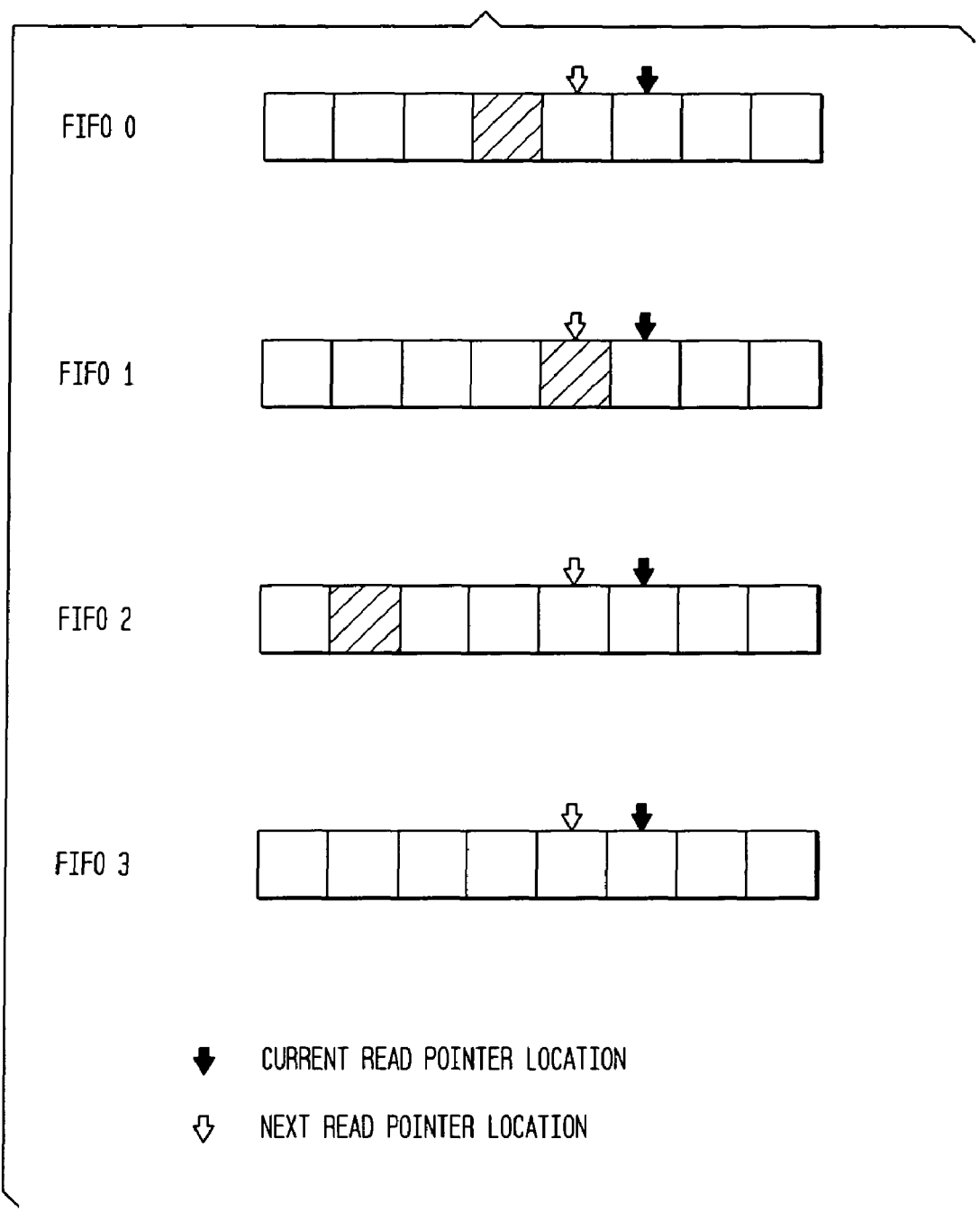
FIG. 5 is a block diagram illustrating a third exemplary read pointer alignment among multiple FIFOs in accordance with the present invention.

FIG. 3 is a block diagram illustrating a first exemplary read pointer alignment among multiple FIFOs in accordance with the present invention. FIG. 4 is a block diagram illustrating a second exemplary read pointer alignment among multiple FIFOs in accordance with the present invention. FIG. 5 is a block diagram illustrating a third exemplary read pointer alignment among multiple FIFOs in accordance with the present invention. For these examples of FIGS. 3-5, the exemplary method is illustrated for deskewing four channels; those of skill in the art will recognize that the methodology may be applied to any number of channels.

As illustrated in FIGS. 3-5, each FIFO generates a "MYCOMMA" signal if there is a comma signal within the scope of the corresponding FIFO. For example, a character is considered to be such a data alignment signal if the least significant 7 bits are equal to "1111100" or "0000011". There cannot be more than one comma decode register bit written within the same FIFO at the same time; accordingly, after a comma character is decoded and written into a comma decode register, subsequent comma signals are ignored while a comma character is stored in the FIFO. All of the FIFOs participating in the deskewing exchange MYCOMMA signals.

Continuing to refer to FIGS. 3-5, each FIFO generates a "NEXT_MYCOMMA" signal if the next character to be read from this FIFO is a comma character. These signals are also shared or exchanged among the FIFOs. Deskewing is controlled by a start signal, enabling the commencement of the deskewing process. When enabled, deskewing is performed when all of the FIFOs in the group report MYCOMMA=1, and at least one FIFO reports NEXT_MYCOMMA=1. Under these conditions, the comma location indicated by the comma decode register 125 of each channel is read into the read pointer register 125 of that channel, such that commas will then be read from all channels on the next read cycle, as illustrated in FIG. 3.

More particularly, referring to FIG. 3, FIFO 1 reports MYCOMMA=1 and NEXT_MYCOMMA=1, indicating the presence of a data alignment signal and that such data alignment signal will be read during the next read cycle. FIFO 0, FIFO 2 and FIFO 3 each report MYCOMMA=1 and NEXT_MYCOMMA=0, indicating the presence of a data alignment signal and that such data alignment signal will not be read during the next read cycle. As the conditions for synchronization exist, as illustrated in FIG. 3, all read pointers are manipulated to read from the comma location during the next read cycle, thereby providing for data deskewing among the multiple channels.

As another example, referring to FIG. 4, all FIFOs reports MYCOMMA=1 and NEXT_MYCOMMA=1, indicating the presence of a data alignment signal and that such data alignment signal will be read during the next read cycle. In this case, while all read pointers are manipulated to read from the comma location during the next read cycle, no further alignment was actually needed. Importantly, as a significant advantage over the prior art, no data has been lost or corrupted, as no data has been allowed to be skipped or overwritten.

As another example, referring to FIG. 5, FIFO 1 reports MYCOMMA=1 and NEXT_MYCOMMA=1, indicating the presence of a data alignment signal and that such data alignment signal will be read during the next read cycle. FIFO 0 and FIFO 2 each report MYCOMMA=1 and NEXT_MYCOMMA=0, indicating the presence of a data alignment signal and that such data alignment signal will not be read during the next read cycle. FIFO 3 reports MYCOMMA=0 and NEXT_MYCOMMA=0, indicating the absence of a data alignment signal and, additionally, that no such data alignment signal will be read during the next read cycle. As the conditions for synchronization do not exist, as illustrated in FIG. 5, the read pointers are not manipulated, with data being read from the next sequential read location, without additional synchronization or deskewing. Again, as a significant advantage over the prior art, no data has been lost or corrupted, as no data has been allowed to be skipped or overwritten.

While these various example illustrate potentially dropping bytes when a read pointer may be advanced for deskewing (FIG. 3, FIFOs 0, 2 and 3), it should be noted that in other instances, read pointers may be retarded or moved back, such that previously read data may be re-read in synchronization with other channels.

FIG. 6 is a block diagram illustrating a system 300 embodiment in accordance with the present invention. The system 300 is typically coupled or connected to the various data sources, such as a PCI bus or other parallel data lines and serial data lines, for example, when embodied within a SERDES device.

The system 300 includes an interface 315, such as for coupling to the data sources, a processor 310 and a memory 320. The network interface 315 is utilized to receive and transmit information and other data, control messages, and other pertinent information. The memory 320 is preferably an integrated circuit (such as random access memory (RAM) in any of its various forms such as DRAM, SDRAM, or the other memory forms discussed below), but also may be a magnetic hard drive, an optical storage device, or any other type of data storage apparatus. The memory 320 is used to store data, and may include one or more FIFOs discussed above, and also may store information pertaining to program instructions or configurations, if any (discussed below).

Continuing to refer to FIG. 6, the processor 310 may include a single integrated circuit ("IC"), or may include a plurality of integrated circuits or other components connected, arranged or grouped together, such as microprocessors, digital signal processors ("DSPs"), custom ICs, application specific integrated circuits ("ASICs"), field programmable gate arrays ("FPGAs"), associated memory (such as RAM and ROM), and other ICs and components. As a consequence, as used herein, the term processor should be understood to equivalently mean and include a single IC, or arrangement of custom ICs, ASICs, processors, microprocessors, controllers, FPGAs, or some other grouping of integrated circuits which perform the functions discussed above, with associated memory, such as microprocessor memory or additional RAM, DRAM, SRAM, MRAM, ROM, EPROM or $E^2$PROM. The processor 310 with its associated memory may be adapted or configured (via programming or hardwiring) to perform the methodology of the invention, as discussed above. For example, the methodology may be programmed and stored, in the processor 310 with its associated memory (and/or memory 320) and other equivalent components, as a set of program instructions (or equivalent configuration or other program) for subsequent execution when the processor 310 is operative (i.e., powered on and functioning). Equivalently, when the processor 310 with its associated memory and other equivalent components are implemented in whole or part as FPGAs, custom ICs and/or ASICs, the FPGAs, custom ICs or ASICs also may be designed, configured and/or hard-wired to implement the methodology of the invention.

Numerous advantages of the present invention are readily apparent. The present invention provides for data alignment and synchronization, without allowing data to be corrupted or overwritten, by alignment and synchronization of each read pointer for each data channel of a multichannel system. When all channels which are to be synchronized have received a data alignment or synchronization signal (such as a comma character used in fiber optic communication), and when the next FIFO block to be read in one of the channels is such a data alignment or synchronization signal (comma), then all read pointers are advanced or moved to their corresponding comma locations for reading from the corresponding FIFO. When either or both of these conditions is or are not met, the read pointers are not altered, with data conversion or transmission continuing without interruption or change.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. A method for data content deskewing among a plurality of data channels for data synchronization, the method comprising:
   determining whether a data alignment signal has been written, for each data channel of the plurality of data channels;
   when a data alignment signal has been written in a data channel of the plurality of data channels, determining a corresponding channel location of the data alignment signal for each data channel having the data alignment signal; and
   when each data channel of the plurality of data channels has the data alignment signal, and when the data alignment signal is to be read on a next read cycle in at least one data channel, moving a corresponding read pointer for each data channel of the plurality of data channels to the corresponding channel location of the data alignment signal, wherein the read pointer is moved to a data location for data which has or has not been read previously.

2. The method of claim 1, wherein the data alignment signal is a comma character.

3. The method of claim 1, wherein data is written into each data channel of the plurality of data channels based on a first clock signal, and data is read from each data channel of the plurality of data channels based on a second clock signal.

4. The method of claim 1, further comprising:
   synchronously reading the data alignment signal from each data channel of the plurality of data channels during the next read cycle.

5. The method of claim 4, further comprising:
   synchronously reading data in parallel from each data channel of the plurality of data channels during a subsequent read cycle.

6. The method of claim 5, further comprising:
   serializing the data synchronously read in parallel from each data channel of the plurality of data channels for serial data transmission.

7. The method of claim 1, wherein the determination of the corresponding channel location of the data alignment signal for each data channel having the data alignment signal further comprises:
   decoding the data alignment signal and storing a data alignment bit in a data alignment signal register.

8. The method of claim 1, wherein the movement of the corresponding read pointer for each data channel of the plurality of data channels to the corresponding channel location of the data alignment signal further comprises:
   copying the data alignment signal register to a read pointer register.

9. An apparatus for data content deskewing among a plurality of data channels for data synchronization, the apparatus comprising:
   a data memory;
   a read pointer register coupled to the data memory, the read pointer register adapted to store a read pointer address;
   a write pointer register coupled to the data memory, the write pointer register adapted to store a write pointer address;
   a data alignment signal decoder adapted to determine a presence of a data alignment signal in data written to the data memory;
   a data alignment signal register adapted to store a data memory location when the data alignment signal has been written to the data memory; and
   a state machine coupled to the data memory, the state machine adapted to determine whether the data alignment signal has been written to the data memory; to move the read pointer to data memory location of the data alignment signal when each data channel of the plurality of data channels has the data alignment signal and when the data alignment signal is to be read on a next read cycle in at least one data channel; and wherein the state machine is adapted to advance the read pointer to a data memory location having data which has or has not been read previously.

10. The apparatus of claim 9, wherein the data alignment signal is a comma character.

11. The apparatus of claim 9, wherein data is written into each data channel of the plurality of data channels based on a first clock signal, and data is read from each data channel of the plurality of data channels based on a second clock signal.

12. The apparatus of claim 9, wherein state machine is adapted to copy the data memory location stored in the data alignment signal register to the read pointer register.

13. A system for data content deskewing among a plurality of data channels for data synchronization, the system comprising:
 a memory adapted to store data for each data channel of the plurality of data channels and, for each data channel, further adapted to store a read pointer, a write pointer, and a data alignment signal bit; and
 a processor coupled to the memory, the processor adapted to determine whether a data alignment signal has been written, for each data channel of the plurality of data channels; to determine a corresponding channel location of the data alignment signal for each data channel having the data alignment signal; and to move a corresponding read pointer for each data channel of the plurality of data channels to the corresponding channel location of the data alignment signal when each data channel of the plurality of data channels has the data alignment signal, and when the data alignment signal is to be read on a next read cycle in at least one data channel and wherein the processor is adapted to advance the read pointer to a data memory location having data which has or has not been read previously.

14. The system of claim 13, wherein the data alignment signal is a comma character.

15. The system of claim 13, wherein data is written into each data channel of the plurality of data channels based on a first clock signal, and data is read from each data channel of the plurality of data channels based on a second clock signal.

16. The system of claim 13, wherein the processor is adapted to synchronously read the data alignment signal from each data channel of the plurality of data channels during the next read cycle.

17. The system of claim 16, wherein the processor is adapted to synchronously read data in parallel from each data channel of the plurality of data channels during a subsequent read cycle.

18. The system of claim 17, wherein the processor is adapted to serialize the data synchronously read in parallel from each data channel of the plurality of data channels for serial data transmission.

19. The system of claim 13, wherein the processor is adapted to determine the corresponding channel location of the data alignment signal for each data channel having the data alignment signal by decoding the data alignment signal and storing a data alignment bit in a data alignment signal register of the memory.

20. The system of claim 19, wherein the processor is adapted to copy the data alignment signal register to a read pointer register.

21. The system of claim 19, wherein the system is embodied in a serializer/deserializer.

* * * * *